United States Patent [19]

Kaukeinen

[11] Patent Number: 4,816,381

[45] Date of Patent: Mar. 28, 1989

[54] METHOD FOR FABRICATING PLZT LIGHT VALVE DEVICE

[75] Inventor: Joseph Y. Kaukeinen, Rochester, N.Y.

[73] Assignee: Eastman Kodak Company, Rochester, N.Y.

[21] Appl. No.: 74,849

[22] Filed: Jul. 17, 1987

[51] Int. Cl.[4] .................................................. G03C 5/00
[52] U.S. Cl. ................................... 430/319; 430/311; 332/7.51; 350/392; 357/72
[58] Field of Search .............. 430/322, 311, 339, 327, 430/313, 319; 437/207, 211, 219, 224; 332/7.51; 350/392, 589; 357/72

[56] References Cited

U.S. PATENT DOCUMENTS

| | | | |
|---|---|---|---|
| 3,978,578 | 9/1976 | Murphy | 437/205 |
| 4,068,923 | 1/1978 | Toida | 350/160 LC |
| 4,158,201 | 6/1979 | Smith et al. | 340/783 |
| 4,217,160 | 8/1980 | Perregaux | 156/239 |
| 4,393,130 | 7/1983 | Ho et al. | 430/313 |
| 4,422,732 | 12/1983 | Ditzik | 350/356 |

FOREIGN PATENT DOCUMENTS 8605002  8/1986  PCT Int'l Appl. .

Primary Examiner—José G. Dees
Attorney, Agent, or Firm—John D. Husser

[57] ABSTRACT

A method of fabricating a modulator panel for use in a light valve device, includes forming a metal pattern of spaced address electrode and pad portions on an ingress surface of the panel; heating the panel in a nitrogen atmosphere to remove moisture from the ingress surface; spin coating the ingress surface with a photoresist composition; and exposing and developing the photoresist coating so that the developed coating remains as a moisture impermeable layer, except over the electrode pad portions of the ingress surface.

2 Claims, 2 Drawing Sheets

METHOD FOR FABRICATING PLZT LIGHT VALVE DEVICE

FIELD OF INVENTION

The present invention relates to light valve devices comprising electrooptic modulator panels, formed for example of PLZT (lathanum substituted lead titanite zirconate) material and more specifically to improved methods for fabricating such modulator panels to provide improved inter-element uniformity in electrooptic transmission.

BACKGROUND OF INVENTION

U.S. application Ser. No. 702,542 entitled "Elimination of Field-Induced Instabilities in Electrooptic Modulators" and filed Feb. 19, 1985 by J. A. Agostinelli described improved light valve devices and device fabrication methods which employ a water impermeable barrier layer, on portions of PLZT modulator panels of devices, to significantly reduce light transmission nonuniformity. In general light valve devices of this kind employ an electroded PLZT modulator panel sandwiched between crossed polarizers and the panel is activated to operate in a quadratic Kerr cell mode. Thus the modulator panel comprises a plurality of electrodes formed on one major surface in a manner allowing selective application of discrete electric fields across respective pixel portions of the panel. When the field is present across a particular pixel portion it becomes birefringent and the polarization of light passing therethrough from the ingress polarizer is changed so as to pass through the egress polarizer. When a field is absent the modulator material remains isotropic so that egressing light is blocked by the egress polarizer.

The above cited Agostinelli application teaches that space charge induced nonuniformities of such light valve devices are increased by moisture around the modulator panel pixel portions. That disclosure teaches that such nonuniformities can be reduced by removing moisture from the modulator surface (e.g. by heating) and overcoating that surface with an electrically insulating, optically isotropic, water impermeable barrier layer (e.g. an acrylic coating).

SUMMARY OF INVENTION

One significant purpose of the present invention is to provide improved procedures and materials for effecting the general method of the above noted Agostinelli application.

In one aspect this object is effected in accord with the invention by a method of fabricating a modulator panel for use in a light valve device, which method comprises forming a pattern of spaced address electrode and pad patterns on an ingress surface of the panel; heating the panel in a nitrogen atmosphere to remove moisture from the ingress surface; spin coating the ingress surface with a water impermeable photoresist composition; and exposing and developing the photoresist coating so that the developed coating remains except over the electrode pad areas on the egress surface.

BRIEF DESCRIPTION OF THE DRAWINGS

The detailed description of the present invention refers to the attached drawings wherein.

DETAILED DESCRIPTION OF PREFERRED EMBODIMENTS

Figure 1:
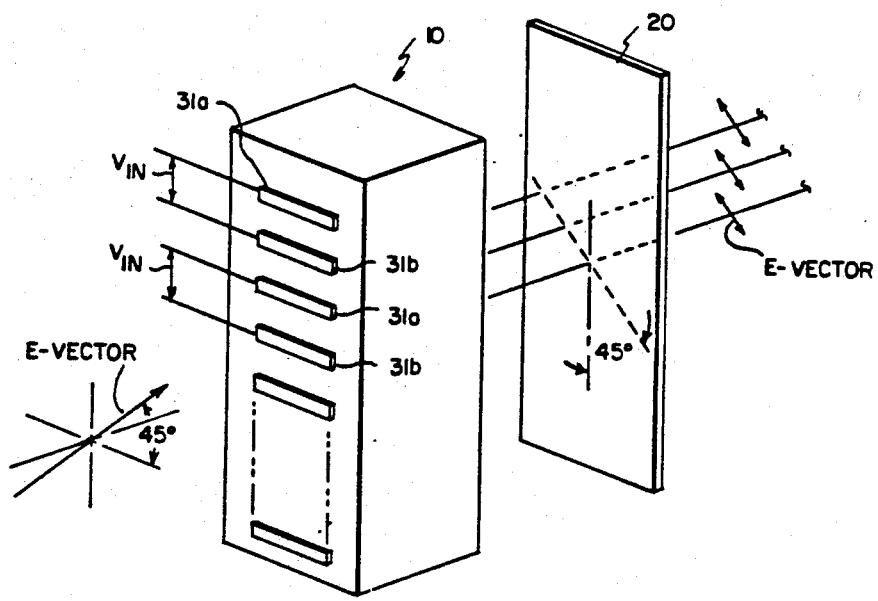
FIG. 1 is a schematic perspective view illustrating one embodiment of light valve array device with which the present invention is useful.
Figure 2:
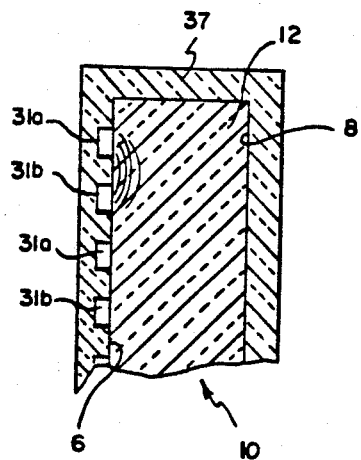
FIG. 2 is a cross-section of a light valve array device such as shown in FIG. 1 and incorporating a barrier layer construction that can be applied in accordance with the present invention.

The device shown schematically in FIG. 1 comprises a modulator panel 10 formed of a PLZT wafer having a plurality of electrode pairs 31a, 31b which defined pixel portions therebetween and which are adapted to provide selectively electric field $V_{IN}$ within the depth of the panel and across such pixel portions (see FIG. 2). FIG. 1 also illustrates the E-vector of light passing from ingress polarizer (not shown) to the ingress of panel 10 and the E-vector of light shifted by the applied field $V_{IN}$ and passing to and through egress polarizer 20.

FIG. 2 shows that modulator panel 10 can comprise the electrooptic wafer portion 12 with ingress and egress surfaces 6 and 8 and a water impermeable overcoat layer 37.

I have found that the construction and performance of light valve devices such as shown and described with respect to FIGS. 1 and 2 can be greatly enhance by the selection of preferred fabrication materials and techniques which constitute the contribution of this invention. The following detailed description of one preferred light valve modulator fabrication in accord with the present invention will illustrate its various inventive aspects.

This fabrication embodiment commenced with the precleaning of 3.5 inch diameter PLZT wafer (identified as 9065 by Motorola). This precleaning included immersion sequentially in three different organic solvents, respectively in order of cleaning, trichloroethylene, acetone and proponal. The sample was held in a fluoroware holder and immersed in the respective solvents contained in a 1×5×7 inch Pyrex vessel. These vessels, in turn, were put in a 150° F. heated water bath and ultrasonically agitated using a Bronson E-Module ultrasonic generator. The cleaning and ultrasonic treatment in each solvent was for at least 30 min. All the cleaning was carried out in a clean hood (Microviod IV M, Air Control Inc.).

Next, metal surface electrodes, in the form of groups of 48 pixel arrays, were fabricated on the cleaned PLZT wafer by using a liftoff process such as described by M. Hatzakis, "Single Step Optical Lift-Off Process", IBM Res. Develop., Vol. 24, No. 4, July 1980. The preparatory work proceeding the actual metalization step was done in a class 10,000 clean room under yellow lights at a controlled temperature and humidity of 21° C. and 40%. The electrode formation procedures included steps I–IX as follows:

Step I—An adhesion promoter and photoresist were applied (spin coated), as follows:

a. hexamethyldisilazane (HMDS) filtered to 0.2 micron, allowed to soak for 15 sec., spun for 40 sec. at 2.5 krpm; and b. photoresist (PPH 3135-30.5 SF, ROK Div. Chem. Tech.), filtered to 0.2 micron, spun for 40 sec. at 2.5 krpm.

Step II—Next the wafer was prebaked in air at 72°-73° C. for 20 minutes.

Step III—The panel was then exposed by means of a Canon PL-501 mask aligner, with a soft contact 20 micron gap using a 48 element chrome mask which was cleaned before a 15 light integral exposure.

Step IV—The wafer was soaked in chlorobenzene for 6 minutes and blown dry with a nitrogen gun.

Step V—Next the photoresist was developed in AZ developer PPD 5135 (ROK Div. Chem. Tech.) diluted 1:1 with water for 70 sec. development time in 1×5×7 inch glass tank with reciprocating motion for agitation.

Step VI—The wafer was rinsed for 3-5 minutes in running deionized water and then spun dry and stored under nitrogen until the evaporation step.

Step VII—While under nitrogen, the wafer was pretreated for 10 minutes in a UV ozone generator at a distance of a few mm from the lamps with an ozone flow of 1.5 lpm.

Step VIII—Vacuum deposition (Temescal CV-8 with FDC-8000 film controller) was effected as follows:
 a. chrome was evaporated at 1 Ang/sec to a total thickness of 100 Ang; then
 b. without breaking vacuum, aluminum was evaporated immediately at 40 Ang/sec to a total thickness of 9000 Ang.

Step IX—Liftoff was performed by immersing the wafer in 150° F. acetone bath under ultrasonic agitation. Most of the unwanted aluminum and photoresist was removed after 10 minutes, but the wafer was left in the bath for 1 hour and 15 minutes to remove troublesome areas.

The wafer was again stored under nitrogen until application of barrier layer and at this point the PLZT wafer contained numerous 48 pixel arrays of parallel gap chrome/aluminum electrodes. Next in accord with the present invention, a unique moisture barrier layer was applied and portions of that barrier layer were selectively removed to accommodate the wire bonding, to metal pads, of the field applying electrodes of the array. The processing steps for the barrier layer application were carried out in a class 10,000 clean room at 21° C. and 40% relative humidity under yellow lights, and comprise steps X-XX, as follows:

Step X—The wafer was etched in an acid mixture of 200 ml of $H_3PO_4$, 10 ml of $HNO_3$ and 40 ml of $H_2O$ for 2 minutes and thereafter washed in deionized water for 30 minutes.

Step XI—Moisture removal was performed by heating the wafer in a nitrogen atmosphere for 2 hours at 200° C.

Step XII—Next, spin coating of a barrier layer was effected as follows:
 a. A barrier layer composition (a negative photoresist) had been prepared to comprise:
 solvent, 100 g chlorobenzene
 sensitizer, 1.5 g KC-99 EK #17728
 activator, 1.5 g EDAB (Aldrich Chemical Co.)
 monomer, 15 g SR-399 (Sartomer Co. Div. ARCO Chem. Corp.)
 polymer, 17 g Elvacite 2021 (DuPont Corp.)
 b. The above barrier layer composition, which had been filtered to 0.8 micron and held at room temperature, was spun coated onto the wafer at 3 krpm for 40 seconds to produce a 2.5 micron coating over the entire ingress surface of the wafer.

Step XIII—A pre-exposure bake of the wafer was performed by heating at 90° C. for 10 minutes in air.

Step XIV—Exposure of the electrode pads was effected with a Canon PL 502 mask aligner thru chrome mask, using a UC 10 filter at a proximity of 5 microns for 50 light integral exposure.

Step V—A post exposure bake of the wafer was effected by heating at 140° C. for 10 minutes in air.

Step XVI—Development was then effected using xylene/heptanone developer, mixed 1:1, by spinning the wafer at 500 rpm and applying that developer on the spinning wafer from a squeeze bottom for 1.5 minutes.

Step XVII—The wafer was then spun at 500 rpm for 4 minutes followed by 1 minute at 1 krpm to effect drying.

Step XVIII—Post baking was next effected by heating the wafer at 140° C. for 15 minutes in a nitrogen atmosphere.

Step XIX—A UV flood exposure of 50 light integral was effected with the Canon PL 501 mask aligner. The wafer now had a moisture barrier layer covering the entire wafer and surface electrodes except for the pads which would be used for wire bonding.

Step XX—The wafer was diced on a Disco (DAD-2H-6) saw to cut out one 48 element array, which was mounted in recesses of a circuit board and wire bonded in its pad areas to circuit traces of the board.

Figure 3:
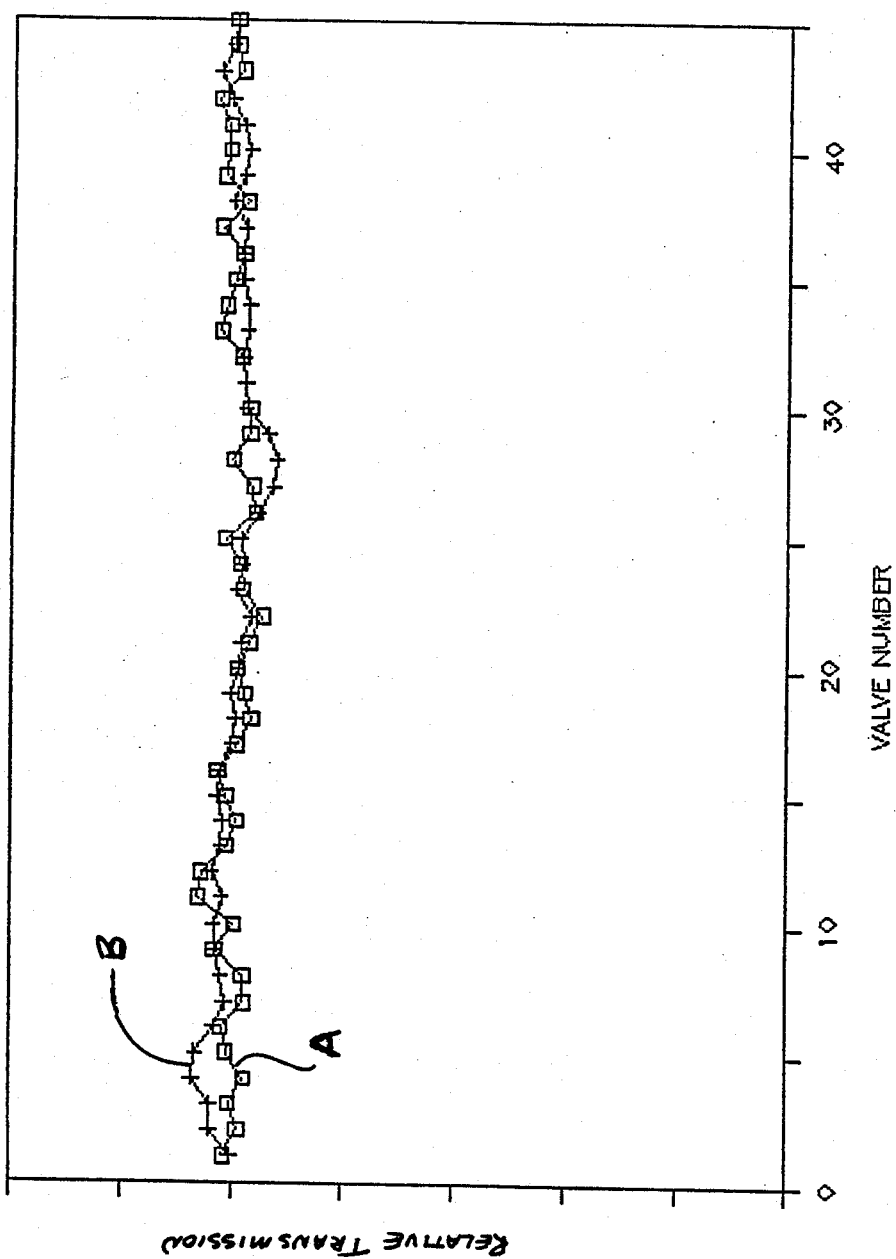
FIG. 3 is a graph showing the relative transmission of light valve pixel portions in the isotropic and birefringement states.

The relative transmittance, through sandwiching crossed polarizers, of each pixel (between electrode gap) was measured and recorded while an electric field was applied across the pixel gap. These results are plotted as curve A of FIG. 3. The excellent uniformity of the array can be observed by comparison of curve A with curve B, which plots the measurement of each pixel transmission through sandwiching, aligned polarizers, without an applied field across the pixel gaps.

One skilled in the art will appreciate that various modifications can be effected with respect to the electrode and modulator materials described above. For example, other useful patternable moisture barrier layers can be used. Useful materials can include photoimagable, transparent, water impermeable compositions such as described in U.S. Pat. Nos. 4,322,490; 4,619,890 and 4,473,623. Other photoreactive polymer, monomer and crosslinkable photoresist-type mixtures can be utilized. For example, cyclized polyisoprenes photoresists such as Kodak 747 photoresist are useful.

The invention has been described in detail with particular reference to preferred embodiments thereof, but it will be understood that variations and modifications can be effected within the spirit and scope of the invention.

I claim:

1. A method of fabricating a modulator panel for use in a light valve device, said method comprising:
 (a) precleaning an electrooptic panel with organic solvent;
 (b) evaporation depositing a metal pattern of spaced address electrode and pad portions on an ingress surface of said panel;
 (c) immersing said ingress surface in an acid etch composition to clean said surface and thereafter washing said etch from said surface with deionized water;
 (d) heating said panel in a nitrogen atmosphere to remove moisture from said ingress surface;
 (e) spin coating said ingress surface in a clean environment with a photoresist composition;
 (f) drying the photoresist coating; and
 (g) exposing and developing said photoresist to form a moisture impermeable coating over said ingress surface except over the electrode pad areas.

2. The invention defined in claim 1, wherein said photoresist coating is a cross-linkable photoresist composition.

* * * * *